(12) United States Patent
Wang

(10) Patent No.: US 7,323,775 B2
(45) Date of Patent: Jan. 29, 2008

(54) MEMORY MODULE

(75) Inventor: Sung-Lai Wang, Wu Gu Shiang (TW)

(73) Assignee: Lih Duo International Co., Ltd., Taipei County (TW)

( * ) Notice: Subject to any disclaimer, the term of this patent is extended or adjusted under 35 U.S.C. 154(b) by 232 days.

(21) Appl. No.: 11/283,806

(22) Filed: Nov. 22, 2005

(65) Prior Publication Data

US 2007/0114660 A1    May 24, 2007

(51) Int. Cl.
*H01L 23/12* (2006.01)
*H01L 23/48* (2006.01)

(52) U.S. Cl. ............... 257/704; 257/697; 257/698; 257/E23.181

(58) Field of Classification Search ........ 257/704, 257/727, 697, 698, E23.181
See application file for complete search history.

(56) References Cited

U.S. PATENT DOCUMENTS 6,168,452 B1 * 1/2001 Lai et al. ............. 439/342
6,186,816 B1 * 2/2001 Lu et al. ............. 439/342
2004/0222514 A1 * 11/2004 Crane et al. ......... 257/697

* cited by examiner

*Primary Examiner*—Nitin Parekh
(74) *Attorney, Agent, or Firm*—Bacon & Thomas, PLLC

(57) ABSTRACT

A memory module comprises a base plate and one or more IC embedding seats formed thereon to provide IC memory chip being installed in detachable manner taking the advantage of easy installation, convenient maintenance or replacement of IC memory chip, particularly no longer using SMT, soldering paste, or flux for IC maintenance and replacement; the IC embedding seat comprises a mainbody and a sliding cover formed a cover to the mainbody with sliding movement to open or close the mainbody, and the mainbody has one or more IC mounting compartments has a plurality of conducting pin units arrayed in matrix arrangement to form electric connection with the base plate; during IC maintenance and replacement, the defective IC memory chip shall be freely removed from the memory module without desoldering to prevent other good IC memory chip from damage due to high temperature.

7 Claims, 5 Drawing Sheets

MEMORY MODULE

BACKGROUND OF THE INVENTION

1. Field of the Invention

The invention relates to a memory module, particularly the memory module provides IC memory chips are installed in detachable manner.

2. Description of the Prior Art

The conventional memory module 10 normally has a structure shown in FIG. 1 which is formed by fixedly installing IC memory chips 70 on one side or both sides of a printed circuit board (PCB) 11 by soldering.

Take the memory module 10 shown in FIG. 1 as an illustrated example, the PCB 11 has a plurality of printed circuit sets 12 on the surface, and each printed circuit set 12 has multiple conductive contacts 13 through which IC memory chip 70 can be installed on the PCB 11 by soldering to form an electric connection with the corresponding printed circuit set 12. Therefore, by employing the same manner a plurality of IC memory chips 70 can be arranged and installed on the PCB 11 to form a memory module 10.

In the memory module 10, the IC memory chip 70 is the major element, and the packing method of the IC memory chip 70 has been gradually improved to involve from the Thin Small Outline Package (TSOP) method to the Ball Grid Array (BGA) method.

Besides, the IC memory chip 70 with Ball Grid Array package shown in FIG. 1 can be installed on PCB by employing Surface Mount Technology (SMT) to join the pads on the underside of the IC memory chip 70 and the conductive contacts 13 of each printed circuit set 12 on the PCB 11 by soldering to fix the IC memory chip 70 on the PCB 11.

However, the drawback of fixing the IC memory chip on PCB 11 by means of pads and soldering is that it will cause inconvenience in replacement and maintenance of IC memory chip. When the IC memory chip 70 is to be removed for repair, in addition to the removal of the original pads by de-soldering with high temperature, new pads must be re-embedded to IC and the repaired IC must be re-positioned and re-soldered to the PCB again. However, there are some difficulties on re-embedding the pads and re-positioning the repaired IC.

Especially, during removal of pads by high temperature the undamaged IC memory chips 70 are likely to be damaged due to high temperature, and, the removed pads and the soldering past as well as flux used during re-embedding the new pads will cause environmental pollution problem that is detrimental to the environment.

SUMMARY OF THE INVENTION

In order to overcome the drawbacks of inconvenience in maintenance and replacement of IC memory chip, the invention disclosed a new memory module structure which allows installation of IC memory chip on memory module in detachable manner without the needs of soldering past and flux, and the new memory module disclosed in the invention possesses the advantageous features of easy installation, convenient maintenance or convenient replacement of IC memory chip and better protection of environment.

The structure of the memory module of the invention comprises a base plate, on which surface has been formed a plurality of printed circuit sets with same function, and one or more IC embedding seats each being in electrical connection with a corresponding printed circuit set on the base plate. The IC embedding seat on the base plate comprises a mainbody and a sliding cover, which are assembled to form a sliding mechanism with relative sliding movement so that the mainbody can be opened and closed by the sliding cover by sliding method, and the mainbody has one or more IC mounting compartment for mounting IC memory chip in detachable manner, i.e., the IC memory chip can be easily mounted into or freely removed from the mounting compartment which is also provided with the effect of positioning the embedded IC memory chip. Arranged on the bottom of each IC mounting compartment of the mainbody is a conducting pin array which is formed by a plurality of conducting pin unit with elasticity and conductivity and arranged in matrix arrangement. Therefore, the electrical connection between the IC memory chip and the corresponding printed circuit set on base plate can be achieved by means of the conducting pin array formed on the mainbody of the IC embedding seat.

When IC memory chip is embedded into IC mounting compartment of the memory module of the invention, an electrical connection between the IC memory chip and the conducting pin array on the mainbody of the IC embedding seat can be achieved which, in turn, can further achieve the electrical connection between the IC memory chip and the base plate of the memory module of the invention, and enable the installation of IC memory chip on the memory module of the invention in detachable manner.

Therefore, when it needs to do maintenance or to replace IC memory chip, the work can be carried out simply by removing the damaged memory chip and replacing it with a new one without high temperature de-soldering, or when it needs to upgrade the IC memory chip by enlarging the memory capacity, the user can easily replace IC memory chip with the one having large memory capacity. These advantageous features can be concluded as follows:

1. Much easier and simpler to carry out maintenance and replacement of IC memory chip.
2. Reduce the bothering cost and work for re-implanting the pads.
3. Replacement and maintenance of IC memory chip can be carried out at any time without the problem of specialized positioning.
4. Avoid IC memory chip getting damaged from high soldering temperature.
5. Replacing IC memory chip or upgrading IC memory chip to enlarge the memory capacity can be easily done by the user itself.
6. Without use of soldering paste and flux to achieve a better effect in environmental protection.

DESCRIPTION OF THE PREFERRED EMBODIMENT

Figure 1:
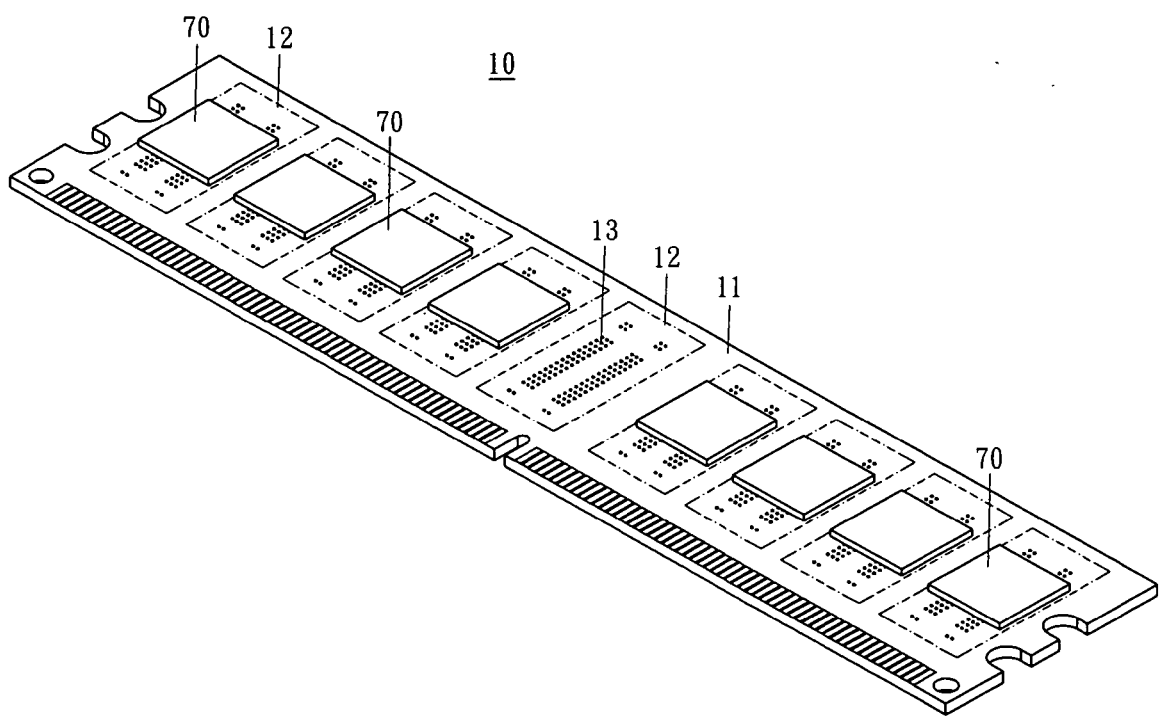
FIG. 1 is the schematic drawing of the structure of conventional type memory module.
Figure 2:
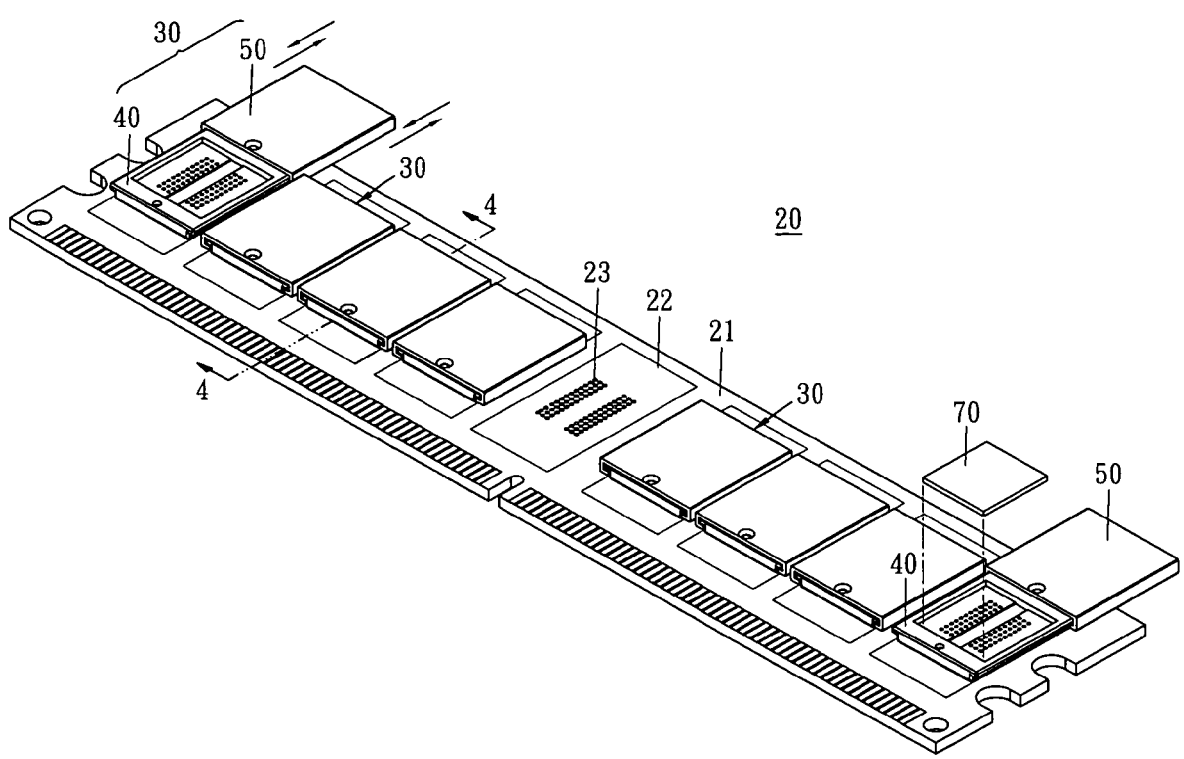
FIG. 2 is the schematic drawing of the memory module of the invention showing that IC memory chip can be installed on memory module in detachable manner.

As illustrated in FIG. 2, the memory module 20 of the invention is structured to allow the IC memory chip 70 to be installed on the memory module 20 in detachable manner. The structure of the memory module 20 has a base plate 21 and one or more IC embedding seats 30 formed on one side or both sides of the base plate 21 to enable the effect of easy installation and easy removal of the IC memory chip 70 on and from the memory module 20.

The base plate 21 is a printed circuit board for installing the memory module 20. A plurality of printed circuit sets 22 with the same functions is disposed on one side or both sides of the base plate 21. And, each printed circuit set 22 has a plurality of contacts 23 through which an electrical connection can be achieved between the IC embedding seat 30 and the corresponding printed circuit set 22 when the IC embedding seat 30 is installed on the base plate 21.

Figure 3:
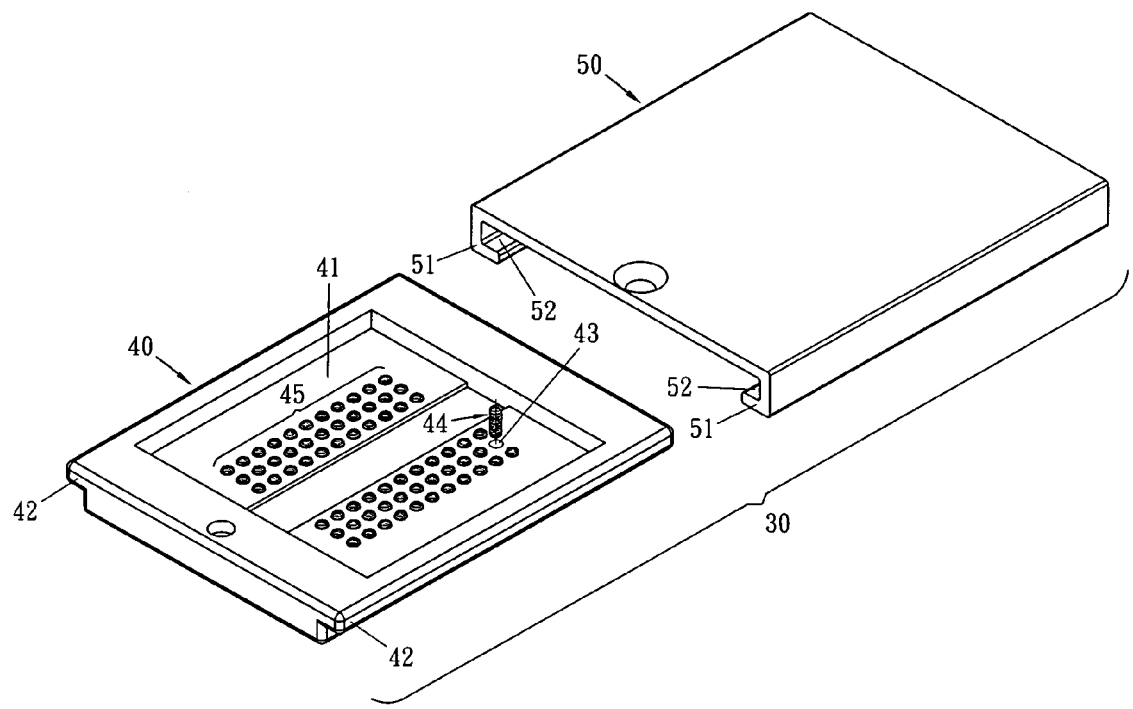
FIG. 3 is the enlarged drawing of the embodiment of the IC embedding seat shown in Fib. 2.

As shown in FIGS. 2 and 3, the construction of the IC embedding seat 30 comprises a mainbody 40 and a sliding cover 50 which jointly forms a sliding mechanism with the sliding cover 50 able to open or close the mainbody 40 by way of generating a sliding movement corresponding to the mainbody 40. Therefore, by sliding movement of the sliding cover 50, the mainbody 40 has a function similar to a cabinet. It can provide an assembly method for the IC memory chip 70 to be embedded into or dismounted from the mainbody 40 freely.

Figure 7:
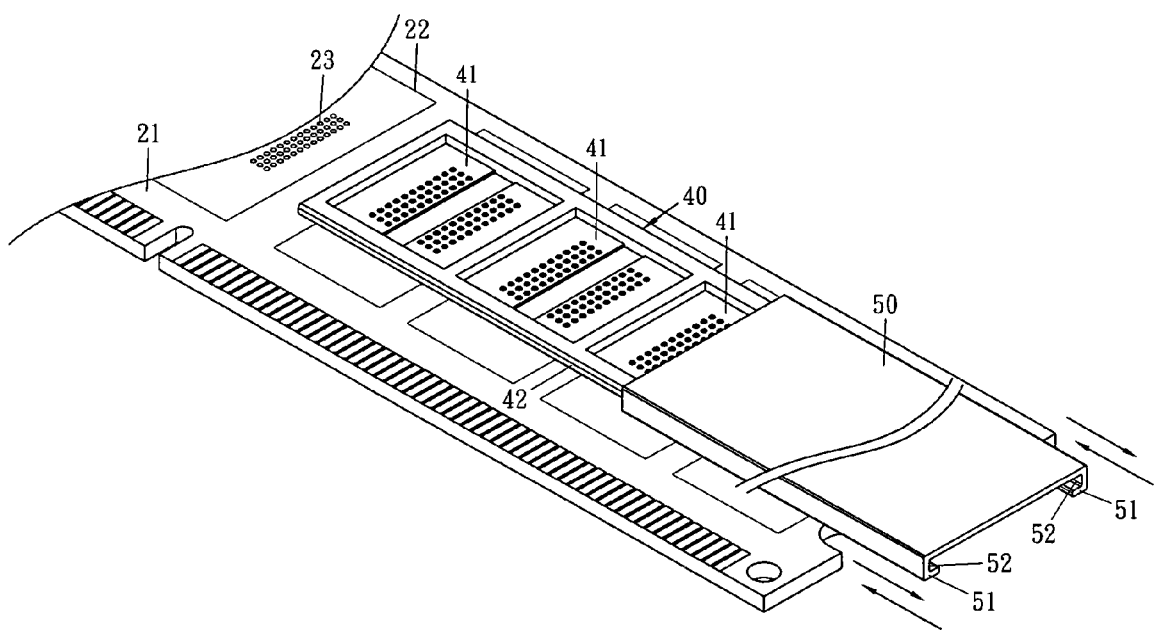
FIG. 7 is the schematic drawing showing the structure of the IC embedding seat of the memory module of the invention in which the mainbody of the IC embedding seat may have one more than one IC mounting compartment.

As shown in FIGS. 3 or 7, the structure of the mainbody 40 comprises one or more IC mounting compartments 41 and two opposite sliding blocks 42 formed on and extended from both sides of the mainbody 40. Particularly, on the bottom of each IC mounting compartment 41 of the mainbody 40 has a plurality of positioning holes 43 formed and arranged in matrix arrangement, and each positioning hole 43 has a conducting pin unit 44 with elasticity and conductivity to form a conducting pin array 45 on the bottom of each IC mounting compartment 41 of the mainbody 40. The embodiment of the conducting pin unit 44 may be a metal spring, or elastic probe pin or a metal dome; however the preferred embodiment is the one using metal spring.

The structure of the sliding cover 50 is shaped by having its two edges bent downwardly to form a bent portions 51 which also forms a sliding slots 52 on both sides opposite to each other and fitted to the corresponding sliding block 42 of the mainbody 40 to construct a sliding mechanism. And, the sliding cover 50 forms the cover of the mainbody 40 to provide means for opening or closing the mainbody 40 by sliding movement.

Figure 4:
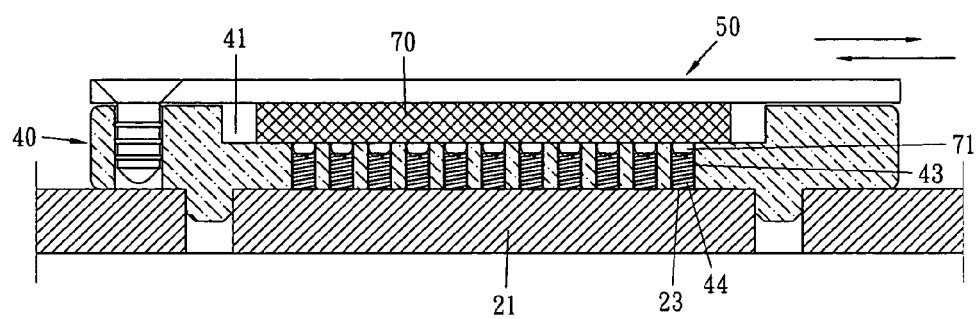
FIG. 4 is the enlarged sectional view along line 4-4 of FIG. 2 showing that the IC embedding seat of the memory module of the invention has the effect of positioning the IC memory chip which carries pads on the underside.

As depicted in FIGS. 2 and 4, after all the IC embedding seats 30 of the memory module 20 are installed on the base plate 21, each of the IC embedding seats 30 is therefore connected to its corresponding printed circuit set 22 on the base plate 21 through the conducting pin array 45 formed in the IC mounting compartments 41 of the mainbody 40.

Moreover, only by moving the sliding cover 50 of the IC embedding seat 30, the mainbody 40 of the IC embedding seat 30 can be opened for installing the IC memory chip 70 packed with Ball Grid Array method carrying pads 71 on the underside into the IC embedding seat 30 of the memory module 20 in detachable manner.

Figure 6:
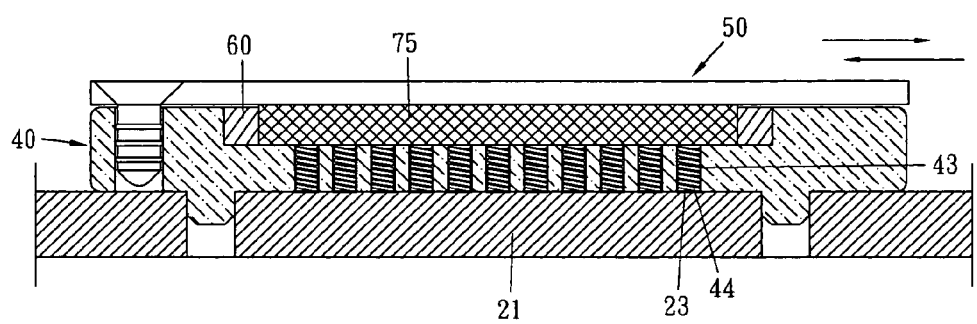
FIG. 6 is the enlarged sectional view along line 6-6 of FIG. 5 showing an IC embedding seat of the present invention using an auxiliary positioning frame to position the plane IC memory chip with flat surface on underside.

In addition, the memory module 20 of the invention is also to provide an assembly method for a kind of IC memory chip with non-BGA package having conductive contacts on the flat underside (which is referred as to the plane IC memory chip 75 as shown in FIG. 6) to easily and freely embed into the IC embedding seat 30 of the memory module 20 in detachable manner.

Further, as shown in FIGS. 4 or 6, after the IC memory chip 70 or the plane IC memory chip 75 is embedded into the mainbody 40 of the corresponding IC embedding seat 30 of the memory module 20 of the invention, the pads 71 on the underside of the IC memory chip 70 (or the conductive contacts on the underside of the plane IC memory chip 75) will touch and press the conducting pin array 45 in the IC mounting compartment 41 of the mainbody 40, and then move the sliding cover 50 in sliding manner to close the mainbody 40 of the IC embedding seat 30 to prevent the IC memory chip 70 (or the plane IC memory chip 75) already embedded in the IC embedding seat 30 from movement, and to enable a tight contact between pads 71 on the underside of the IC memory chip 70 (or the conductive contacts on the underside of the IC memory chip 75) and the corresponding conducting pin units 44 inside the mainbody 40 of the IC embedding seat 30 to form good electric connection.

In other wards, when the IC memory chip 70 (or the plane IC memory chip 75) is embedded into the corresponding mainbody 40 on the IC embedding seat 30 of the memory module 20 of the invention, it needs not to use Surface Mounting Technique (SMT) or any soldering paste and flux to form electric connection. Simply by moving the sliding cover 50 to close the mainbody 40 of the IC embedding seat 30, an electric connection between the embedded IC memory chip 70 (or the embedded plane IC memory chip 75) and the corresponding printed circuit set 22 on the base plate 21 of the memory module 20 can be achieved.

Therefore, by employing the installation manner as described herein the memory module 20 of the invention can achieve the purpose of allowing installation of IC memory chip 70 or the plane IC chip 75 in detachable manner.

Similarly, when the IC memory chip 70 or the plane IC memory chip 75 already installed in the memory module 20 of the invention is to be removed, the only thing needed to do is in sliding manner to move the sliding cover 50 to open the mainbody 40 of the IC embedding seat 30, and then freely remove the IC memory chip 70 or the plane IC memory chip 75 from the mainbody 40 of the IC embedding seat 30 without the needs of high temperature de-soldering procedure.

Therefore, when any defective IC memory chip 70 or plane IC memory chip 75 needed to be repaired or replaced is found in the memory module 20 of the invention, the repair or replacement work can be simply done by removing the defective IC memory chip 70 or plane IC memory chip 75 from the mainbody 40 of the IC embedding seat 30, and then installing a new IC memory chip 70 or plane IC memory chip 75 into the corresponding mainbody 40, i.e., the repair or replacement work is so convenient and simple that it does not need to process de-soldering with high temperature and can prevent other good IC memory chip 70 or plane IC memory chip 75 from damage due to high temperature, and it does not require using SMT, soldering paste, or flux for IC maintenance and replacement and can eliminate the bothering due to re-embedding the pads on IC memory chip and repositioning the IC memory chip.

Further, when the needs of upgrading the memory module 20 and enlarging memory capacity of the IC memory chip 70 or the plane IC memory chip 75 is required by user, the memory module 20 of the invention provides the advantageous feature of being reusable. Simply by removing the IC memory chip 70 or the plane IC memory chip 75 from the embedding seat 30 of the memory module, and then reinstalling new IC memory chip 70 or plane IC memory chip 75 having larger memory capacity, the upgrading of memory module 20 can be achieved, particularly, the upgrading work can be carried out by the user without any problem.

In addition, the IC embedding seat 30 of the memory module 20 of the invention also possesses the effect of positioning the IC memory chip 70 or the plane IC memory chip 75. As illustrated in FIGS. 4 and 6, the memory module 20 of the invention is structured in such a way that the positioning holes 43 formed in each IC mounting compartment 41 of mainbody 40 of IC embedding seat 30 are arranged into matrix form to fit the position of the corresponding pads 71 on the underside of the IC memory chip 70, or to match the position of the corresponding the conductive contacts on the underside of the plane IC memory chip 75.

As illustrated in FIG. 4, when the IC memory chip 70 carrying pads 71 is embedded into the IC mounting compartment 41 of the mainbody 40 of the IC embedding seat 30, the pads 71 on the IC memory chip 70 can embedded into the positioning holes 43 of the mainbody 40 to achieve the effect of positioning the IC memory chip 70.

Figure 5:
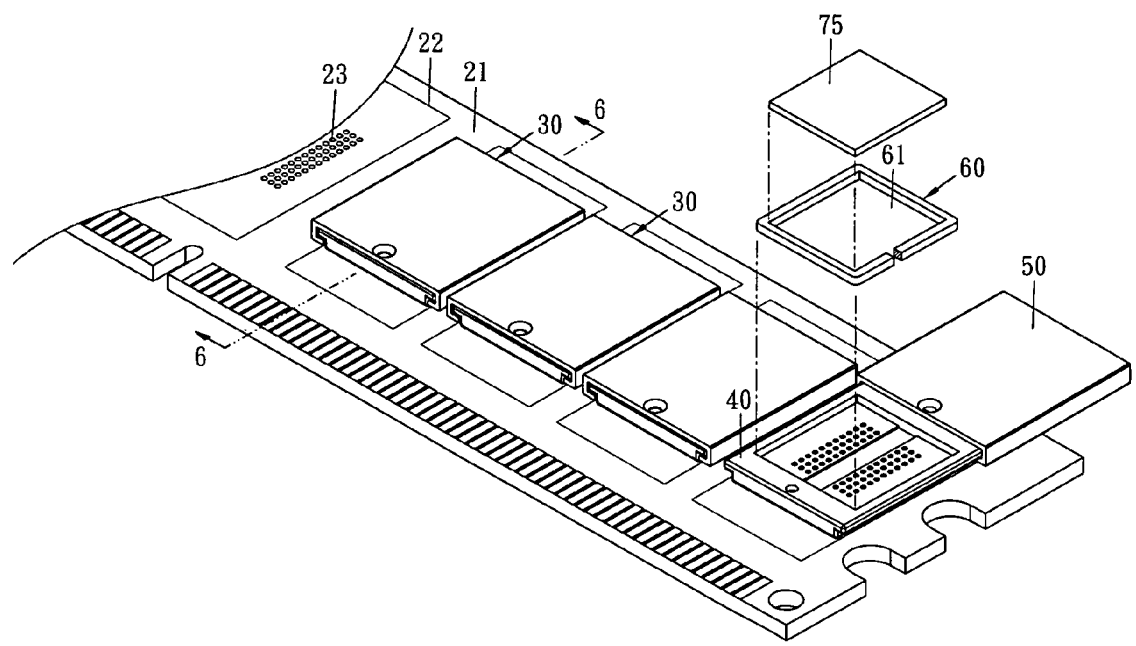
FIG. 5 is a disassembly drawing of the memory module of the invention showing the IC embedding seat uses an auxiliary positioning frame to achieve the application for positioning the plane IC memory chip with flat surface on underside.

And, as illustrated in FIG. 5 and FIG. 6, when the plane memory chip 75 carrying the conductive contacts on the underside is embedded into the IC mounting compartment 41 on the mainbody 40 of the IC embedding seat 30, an auxiliary positioning frame 60 can be employed to achieve the effect of positioning. The auxiliary positioning frame 60 has a hollow inner space 61 in order to tightly hold the plane IC memory chip 75, and the outer circumference of the auxiliary positioning frame 60 is designed to tightly fit the inner circumference of the IC mounting compartment 41 of the mainbody 40 of the IC embedding seat 30 to allow the plane IC memory chip 75 to be tightly embedded into the IC mounting compartment 41 of the mainbody 40.

Therefore, when mounting the plane IC memory chip 75 into IC mounting compartment 41 of the mainbody 40, the plane IC memory chip 75 is tightly embedded into the hollow inner space 61 of the auxiliary positioning frame 60 at first, and then the plane IC memory chip 75 together with the auxiliary positioning frame 60 is tightly embedded into the IC mounting compartment 41 to achieve the effect of positioning the plane IC memory chip 75 in the IC mounting compartment 41 of the mainbody 40 of IC embedding seat 30 of the invention.

Another embodiment of the memory module 20 of the invention has an alternative design to the structure of the IC embedding seat 30 in which the mainbody 40 of the IC embedding seat 30 has sliding slots on both sides, and the sliding cover 50 of the IC embedding seat 30 has sliding blocks arranged to fit the sliding slot of the mainbody 40 and to have the mainbody 40 and the sliding cover 50 jointly formed a sliding mechanism.

As concluded above, by employing the IC embedding seat 30 the memory module 20 of the invention can provide means for installing the IC memory 70 or the plane IC memory chip 75 on the memory module 20 in detachable manner, and the IC memory chip 70 or the plane IC memory chip 75 can be easily removed and replaced at any time that enables the invention provides the specific features of simple installation, convenient maintenance or replacement of IC memory chip 70 or plane IC memory 75.

What is claimed is:

1. A memory module provided integrated circuit chip (IC) memory chip being installed in detachable manner characterized in that the memory module comprises:

a base plate carrying a plurality of printed circuit sets formed thereon, and one or more IC memory chip embedding seats formed on one side or both sides of the base plate and formed an electrical connection with one of the printed circuit sets of the base plate respectively, wherein each IC memory chip embedding seat comprises a mainbody and a sliding cover formed to completely cover a top surface of the main body with sliding movement to open or close the mainbody, and the mainbody has one or more IC memory chip mounting compartments which bottom has an electrically conducting pin array formed by a plurality of electrically conducting pin units with elasticity arrayed in matrix arrangement to form an electrical connection with the printed circuit set of the base plate without using any soldering connection, wherein the IC memory chip embedding seat further includes an auxiliary positioning frame which has a hollow inner space for the IC memory chip tightly embedded therein and has an outer circumference able to tightly fit into the IC memory chip mounting compartment of the mainbody.

2. The memory module as described in claim 1, wherein the conducting pin unit of the IC memory chip mounting compartment of the mainbody is a metal spring, a metal dome or a probe pin.

3. The memory module as described in claim 2, wherein the IC memory chip embedding seat further includes an auxiliary positioning frame which has a hollow inner space for the IC memory chip tightly embedded therein and has an outer circumference able to tightly fit into the IC memory chip mounting compartment of the mainbody.

4. The memory module as described in claim 1, wherein the mainbody has two sliding blocks formed on both sides and extended in outward direction, and the sliding cover has two sliding slots formed on its both sides to correspondingly fit the sliding blocks of the mainbody.

5. The memory module as described in claim 4, wherein the IC memory chip embedding seat further includes an auxiliary positioning frame which has a hollow inner space for the IC memory chip tightly embedded therein and has an outer circumference able to tightly fit into the IC memory chip mounting compartment of the mainbody.

6. The memory module as described in claim 1, wherein the mainbody has two sliding slots formed on both sides, and the sliding cover has two sliding blocks formed on both sides to correspondingly fit the two sliding slots of the mainbody.

7. The memory module as described in claim 6, wherein the IC embedding seat further includes an auxiliary positioning frame which has a hollow inner space for the IC memory chip tightly embedded therein and has an outer circumference able to tightly fit into the IC memory chip mounting compartment of the mainbody.

* * * * *